(12) United States Patent
Kasai

(10) Patent No.: US 8,067,754 B2
(45) Date of Patent: Nov. 29, 2011

(54) PHOTOCONDUCTIVE DEVICE

(75) Inventor: Shintaro Kasai, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 147 days.

(21) Appl. No.: 12/537,458

(22) Filed: Aug. 7, 2009

(65) Prior Publication Data

US 2010/0052083 A1    Mar. 4, 2010

(30) Foreign Application Priority Data

Aug. 27, 2008   (JP) .................. 2008-217851

(51) Int. Cl.
*G08C 19/04* (2006.01)
*G02F 1/015* (2006.01)
*H01L 31/0224* (2006.01)

(52) U.S. Cl. .............. 250/493.1; 359/245; 257/459

(58) Field of Classification Search ............ 250/493.1; 359/245; 257/459
See application file for complete search history.

(56) References Cited

U.S. PATENT DOCUMENTS

| | | | |
|---|---|---|---|
| 7,397,428 B2 * | 7/2008 | Cole et al. | 343/700 MS |
| 7,557,588 B2 | 7/2009 | Ouchi et al. | |
| 7,560,695 B2 | 7/2009 | Kasai et al. | |
| 7,630,588 B2 * | 12/2009 | Ouchi | 385/8 |
| 2004/0207032 A1 * | 10/2004 | Edamura et al. | 257/414 |
| 2007/0229094 A1 | 10/2007 | Kasai et al. | |
| 2008/0224071 A1 * | 9/2008 | Kasai et al. | 250/492.1 |
| 2008/0315098 A1 * | 12/2008 | Itsuji | 250/330 |
| 2009/0201030 A1 | 8/2009 | Ouchi et al. | |
| 2009/0236529 A1 | 9/2009 | Kasai et al. | |
| 2010/0013038 A1 * | 1/2010 | Ouchi | 257/431 |
| 2010/0067203 A1 * | 3/2010 | Safavi-Naeini et al. | 361/752 |
| 2010/0084570 A1 * | 4/2010 | Katagiri | 250/458.1 |
| 2011/0038032 A1 * | 2/2011 | Maki et al. | 359/326 |

FOREIGN PATENT DOCUMENTS

JP    2002-223017 A    8/2002

OTHER PUBLICATIONS

Kasai, et al., U.S. Appl. No. 12/300,791, filed Feb. 24, 2009.

\* cited by examiner

*Primary Examiner* — Evan Pert
(74) *Attorney, Agent, or Firm* — Fitzpatrick, Cella, Harper & Scinto

(57) ABSTRACT

A photoconductive device comprising a photoconductive portion for generating carriers by applied excitation light; a resistance portion in contact with the photoconductive portion; a first conductive portion in contact with the resistance portion; and a second conductive portion that is provided so as to have a gap with respect to the first conductive portion and is in contact with the photoconductive portion.

3 Claims, 14 Drawing Sheets

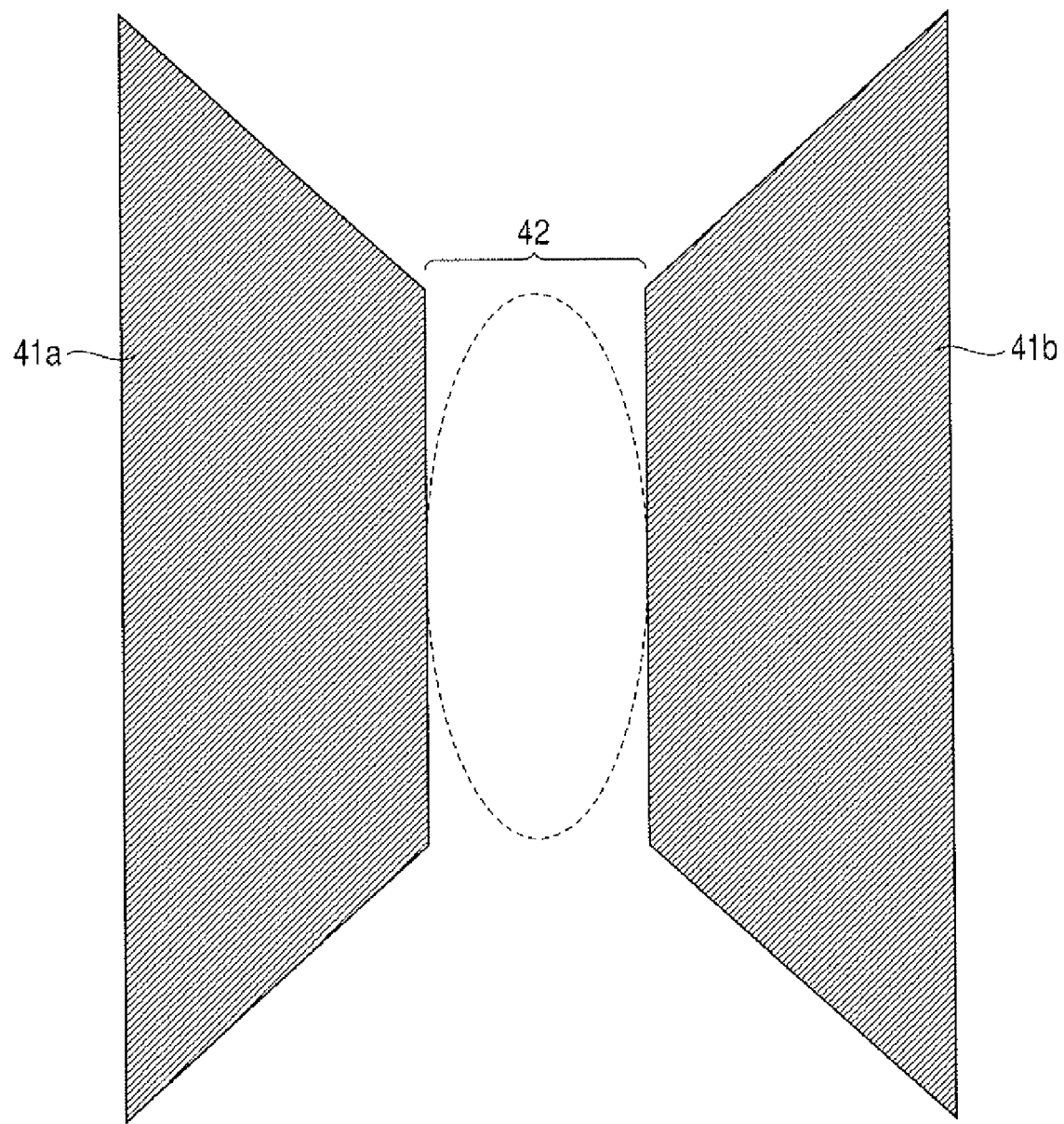

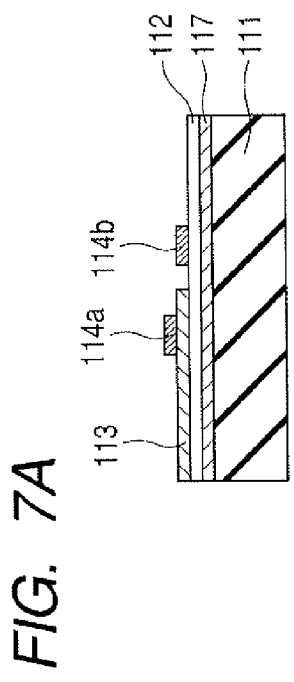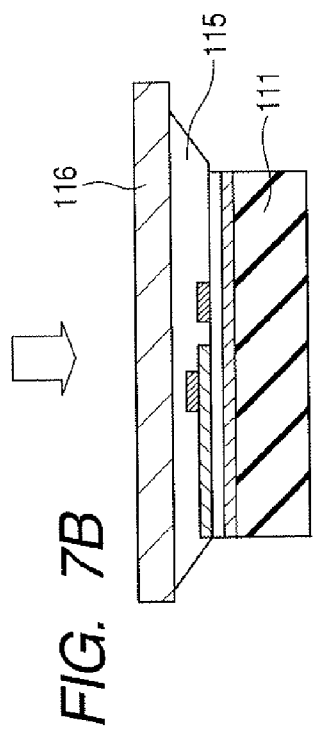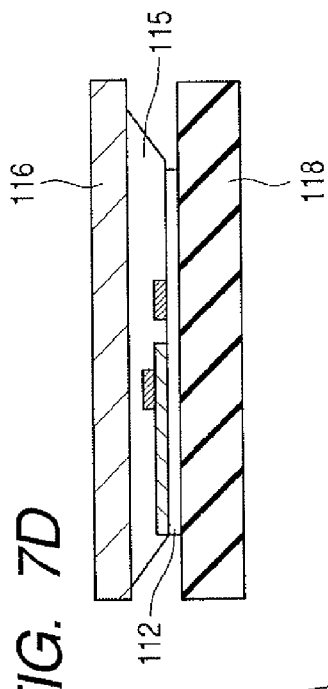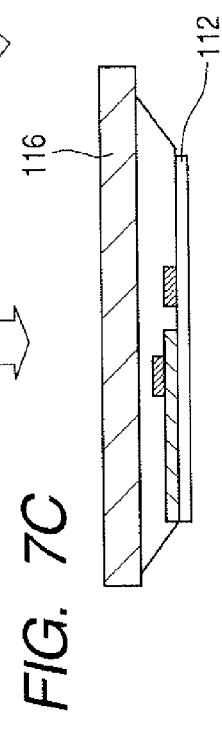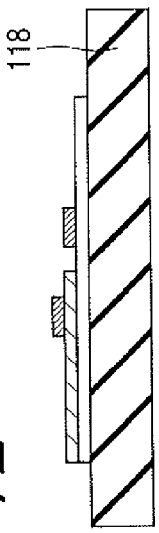

PHOTOCONDUCTIVE DEVICE

BACKGROUND OF THE INVENTION

1. Field of the Invention

The present invention relates to a photoconductive device which can be used as a device for generating an electromagnetic wave in the frequency range of 30 GHz or more and 30 THz or less, i.e., in the frequency region from a so-called millimeter wave to a terahertz wave (which is also called a terahertz wave herein), and a method for producing the same, and apparatus using the same.

2. Description of the Related Art

In recent years, technological developments utilizing terahertz waves have become active. Japanese Patent Application Laid-Open No. 2002-223017 discusses a terahertz wave generating device. As shown in FIG. 10A and FIG. 10B which is a cross section view taken along line 10B-10B of FIG. 10A, the device includes a conductive portion 163 (163a and 163b) formed on a photoconductive portion 162 on a substrate 161 with the two sides separated from each other by a gap 165. One conductive portion 163a and the other conductive portion 163b of the conductive portion 163, which are separated by the gap 165, are disposed to have the gap 165 of about 5 μm. The photoconductive portion 162 often uses low-temperature-grown (LT-) GaAs with crystals grown in a temperature from 200° C. to 300° C. Applying a voltage of about 10 V to the conductive portions 163a and 163b and irradiating the gap 165 with a pulsed laser (its pulse time width being about 100 fs) generates a pulsed terahertz wave. The photoconductive portion 162 and two electrodes (the conductive portion) 163 together are also called a photoconductive antenna.

SUMMARY OF THE INVENTION

In general, as the voltage applied between electrodes becomes higher, the more intense terahertz wave is generated. However, applying a too high voltage to perform irradiation of a laser light causes an excessive current to flow through the photoconductive portion, so that the photoconductive portion may be damaged. The damage to the photoconductive portion generates no terahertz wave, or the intensity of terahertz wave is decreased remarkably.

With the photoconductive portion having a high electric resistance, applying a higher voltage does not cause the damage to the photoconductive portion. On the other hand, with the photoconductive portion having a low electric resistance, only application of a relatively low voltage may cause the damage. Accordingly, with the photoconductive portion using the relatively low electric resistance, a sufficiently high voltage cannot be applied. Therefore, a sufficiently intensive terahertz wave cannot be obtained in many cases.

Even in LT-GaAs, as described above, application of a voltage of about 100 V may cause no damage to the photoconductive portion in the case where the gap between electrodes is about 5 μm. However, application of a higher voltage often causes damage thereto. In this way, regardless of the properties of the material used for the photoconductive portion, application of a high voltage for obtaining the higher intensity in a terahertz wave may cause damage to the photoconductive portion.

In view of the above problem, a photoconductive device of the present invention, which may be used for a terahertz wave generating device or the like, has an optical switch portion including a photoconductive portion in which carriers are generated by light irradiation, and first and second conductive portions, each conductive portion including an antenna portion. The antenna portions of the first and second conductive portions are separated via a gap. One of the antenna portions of the first and second conductive portions is provided in contact with the optical switch portion. A resistance portion is held between the other antenna portion and the optical switch portion while being in contact therewith.

Moreover, in a view of the above problem, a terahertz wave generating apparatus of the present invention includes the photoconductive device; an irradiation portion for irradiating a region of the gap with excitation light; and a voltage applying portion for applying a bias voltage between the first and second conductive portions divided by the gap.

Further, in a view of the above problem, the terahertz wave apparatus of the present invention acquires terahertz wave spectral information or a terahertz wave image of an inspection object, or both of them by using the terahertz wave generating apparatus.

Furthermore, in a view of the above problem, a method for producing a photoconductive device of the present invention is a method for producing the photoconductive device wherein the high resistance portion is formed on the optical switch portion including the photoconductive portion by a crystal growth.

Another photoconductive device according to the present invention has a carrier generating portion for generating carriers by applied excitation light; a resistance portion in contact with the photoconductive portion; a first conductive portion in contact with the resistance portion; and a second conductive portion that is provided so as to have a gap with respect to the first conductive portion and is in contact with the carrier generating portion.

The photoconductive device of the present invention makes it possible to increase resistance between the antenna portion of the first conductive portion and the antenna portion of the second conductive portion separated via the gap to be able to withstand a higher voltage. Thus, the photoconductive device allows a higher voltage to be applied between two conductive portions. Accordingly, for example, the photoconductive device makes it possible to increase intensity of an obtainable maximum terahertz wave.

Further features of the present invention will become apparent from the following description of exemplary embodiments with reference to the attached drawings.

BRIEF DESCRIPTION OF THE DRAWINGS

FIG. 2C is a plane view illustrating a detail of a conductive portion of another modification of the photoconductive device according to Example 1.

FIGS. 7A, 7B, 7C, 7D and 7E are schematic cross section views describing a method for producing a photoconductive device according to Example 4.

DESCRIPTION OF THE EMBODIMENTS

An embodiment of the present invention is described below. An important thing in a photoconductive device such as a terahertz wave generating device of the present invention is that a resistance portion is held between an antenna portion and an optical switch portion of one of two conductive portions while being in contact therewith. Based on this concept, a basic embodiment of a detection device according to the present invention has an optical switch portion including a photoconductive portion in which carriers are generated by light irradiation, and first and second conductive portions, each conductive portion including an antenna portion. The antenna portions of the first and second conductive portions are separated via an appropriate gap. One antenna portion is provided in contact with the optical switch portion. Between the other antenna portion and the optical switch portion, a resistance portion is held in contact therewith. The optical switch portion includes a single photoconductive layer, and a photodiode including the photoconductive layer. The resistance portion includes various dielectrics and semiconductors, but can be a high resistance portion that has a higher electric resistance than that of the photoconductive portion in the gap area in terms of further increasing the withstanding voltage. As in Example 3 described later, the photoconductive film may be provided on a substrate that does not show lattice-matching with the photoconductive film by using a thin-film transfer technology. In such case, materials used for the substrate, the photoconductive film and the resistance portion may be selected flexibly from the wider range of materials.

A terahertz wave generating apparatus may be configured with an irradiation portion for irradiating the gap region with excitation light, and a voltage applying portion for applying a bias voltage between the first and the second conductive portions divided by the gap, by using the photoconductive device. Moreover, a terahertz wave apparatus may be configured by using the terahertz wave generating apparatus. With such configuration, the terahertz wave apparatus acquires terahertz wave spectral information or a terahertz wave image of an inspection object, or both of them.

The photoconductive device may be produced by using a method for forming the resistance portion on an optical switch portion including the photoconductive portion by crystal growth.

Figure 1A:
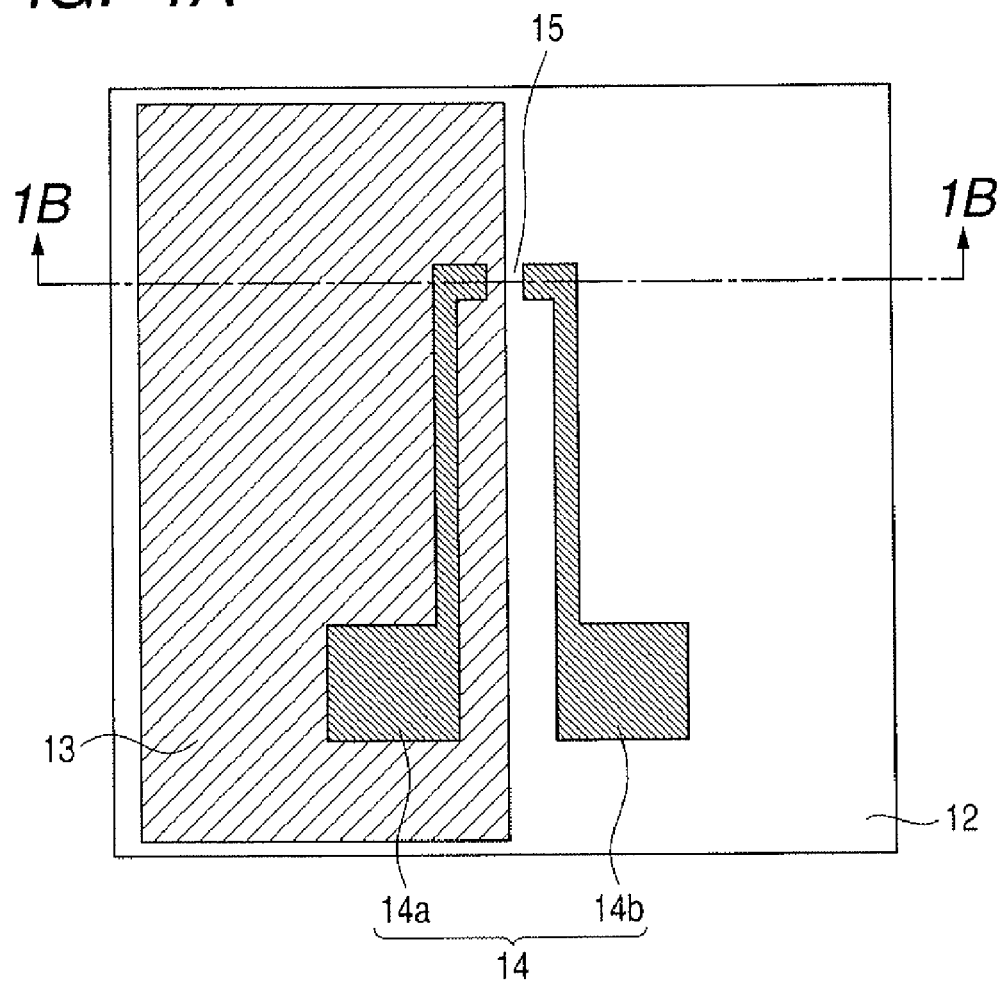
FIG. 1A is a plane view illustrating a photoconductive device according to Example 1.
Figure 1B:
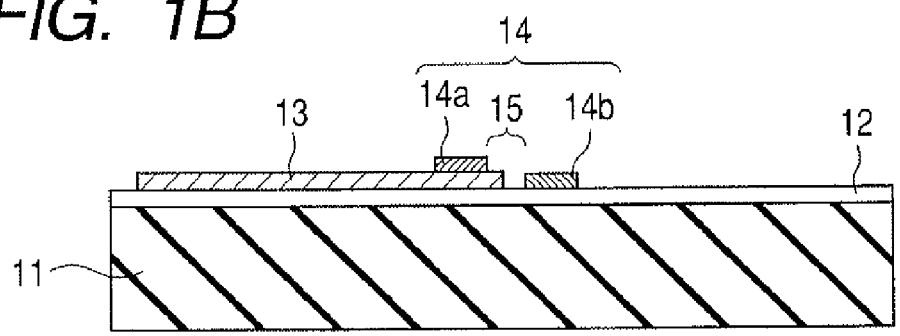
FIG. 1B is a cross section view illustrating the photoconductive device according to Example 1.

An embodiment of the present invention is now described with reference to drawings. An embodiment of the present invention is described with reference to FIGS. 1A and 1B. As shown in FIG. 1A and FIG. 1B which is a cross section view taken along line 1B-1B of FIG. 1A, a terahertz wave generating device, which is a photoconductive device of the present embodiment, has a substrate 11, a photoconductive portion 12 which is an optical switch portion, a high resistance portion 13 which is a resistance portion, a conductive portion 14 including a first conductive portion 14a and a second conductive portion 14b. The conductive portion 14 is divided by a gap 15 into the first and second conductive portions 14a and 14b.

In the present embodiment, the photoconductive portion 12 is a photoconductive film formed by at least one selected from the group consisting of a group IV semiconductor such as Si and Ge; an impurity-implanted semiconductor such as As-implanted GaAs; an ion-implanted semiconductor such as ion-implanted Si, ion-implanted Ge and ion-implanted InGaAs; a low-temperature-grown semiconductor such as low-temperature-grown GaAs, low-temperature-grown InAs, low-temperature-grown InGaAs and low-temperature-grown AlGaAs; a group III-V compound semiconductor such as GaAs and InAs; and a group II-VI compound semiconductor. The photoconductive portion 12 may include a thin film formed on the substrate 11 by epitaxial growth.

A semiconductor material and a semiconductor device having absorption characteristics for excitation light may be applied for the optical switch portion including the photoconductive portion. Such semiconductor materials include gallium arsenide (GaAs) and indium gallium arsenide (InGaAs) described above. Moreover, a device showing a rectification function by excitation light like a photodiode including the photoconductive film may be applied as a semiconductor device. These semiconductor materials and Device structures of the semiconductor device are properly selected according to the wavelength of excitation light and the desired behavior of carriers to be generated (this is determined by carrier mobility and the like of a semiconductor material and the like).

It is not necessary for the photoconductive portion 12 and the substrate 11 to be the same material. For example, an InP substrate is used as the substrate 11, and an InGaAs thin film formed by epitaxial growth on the InP substrate at a low temperature (about 100° C. to about 300° C.) are used as the photoconductive portion 12. In contrast, it is possible to form the photoconductive portion 12 and the substrate 11 with the same material, in which both elements are formed into an integrated object. For example, a semi-insulating substrate (for example, semi-insulating GaAs) is used as the substrate 11, and its surface is used as the photoconductive portion 12.

For the high resistance portion 13, the following various materials may be used: for example, silicon nitride, silicon dioxide, indium oxide, tin oxide, indium titanium oxide, titanium oxide, nickel chrome, polysilicon, InP, GaAs, AlAs, AlGaAs, silicide, Si, semiconductors, resins, ceramics and dielectrics, and a mixture of at least one of these materials and a conducting material, a material doped with a material that makes at least one of these materials conductive, or the like. The above material formed into a thin film form may be used as the high resistance portion 13. A conductive resin mixed with a small quantity of a conducting material such as carbon into a resin or a material mixed with a small amount of metal particles into an insulator may be used as the high resistance portion 13. The high resistance portion 13 desirably has a higher electric resistance than that of the photoconductive portion 12. More precisely, near the gap 15, the high resistance portion 13 between the first conductive portion 14a and the photoconductive portion 12 desirably has a higher electric resistance than the electric resistance of the photoconductive portion 12 between the first and second conductive portions 14a and 14b.

The conductive portions 14a and 14b are formed with a metal material such as titanium, gold, silver, copper, nickel, palladium, platinum, germanium, aluminum, or a semiconductor material. Materials and their alloys described here may be appropriately laminated. In some cases, such materials and their alloys may be adapted to form a mixed crystal for use. The conductive portions 14a and 14b are formed from a highly-conductive material having a lower resistivity than that of the photoconductive portion 12. Another material other than the materials described above may be used, if desired.

Figure 2A:
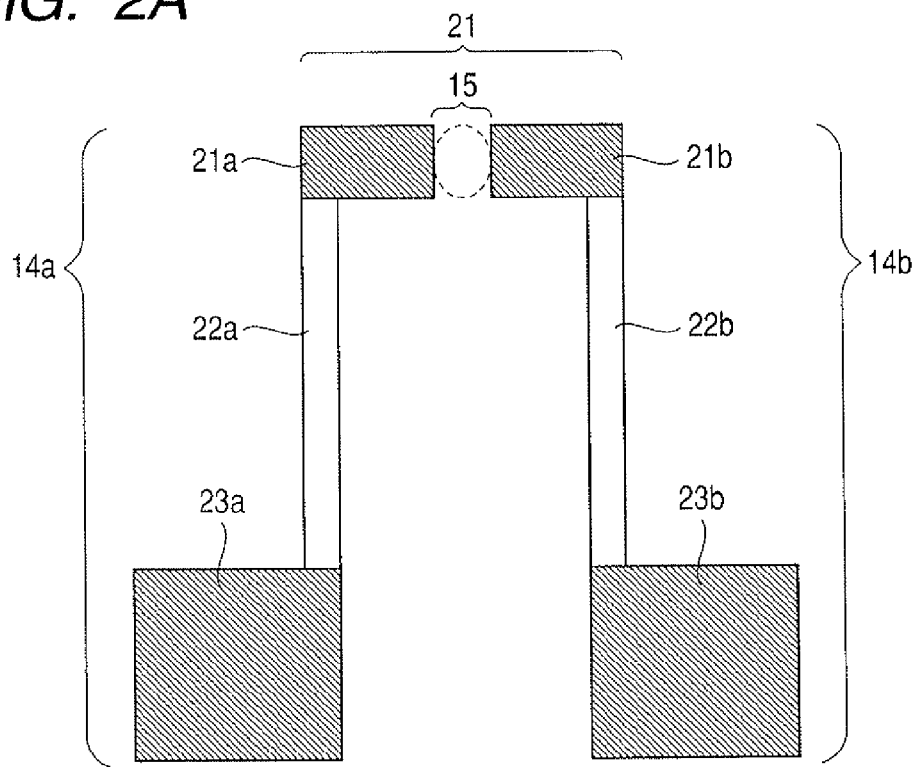
FIG. 2A is a plane view illustrating a detail of a conductive portion of the photoconductive device according to Example 1.

In particular, the conductive portions 14a and 14b include an antenna portion 21 (21a and 21b), electric supply portions 22a and 22b, and electrode portions 23a and 23b, as shown in FIG. 2A. The antenna portion 21 is divided by the gap 15. The antenna portion 21 configures an antenna with one of the divided parts being a first antenna portion 21a and the other being a second antenna portion 21b. The antenna defines the conversion characteristics of electromagnetic wave energy which is converted between a space and the device. Typically, it functions as an impedance converter (antenna) for taking out terahertz waves to the outside. However, the antenna portion, electric supply portion and electrode portion cannot be always defined strictly separately. Depending on the shape of the conductive portion, the electric supply portion also functions as the antenna portion. Alternatively, the electrode portion functions as both the antenna portion and the electric supply portion. An antenna according to the present embodiment in FIGS. 1A and 1B and FIG. 2A is referred to as a so-called dipole antenna type, in which each of the conductive portions 14a and 14b is relatively distinctly-divided into the antenna portion, the electric supply portion and the electrode portion. The conductive portions 14a and 14b may be formed by a photolithography and the like.

Figure 2B:
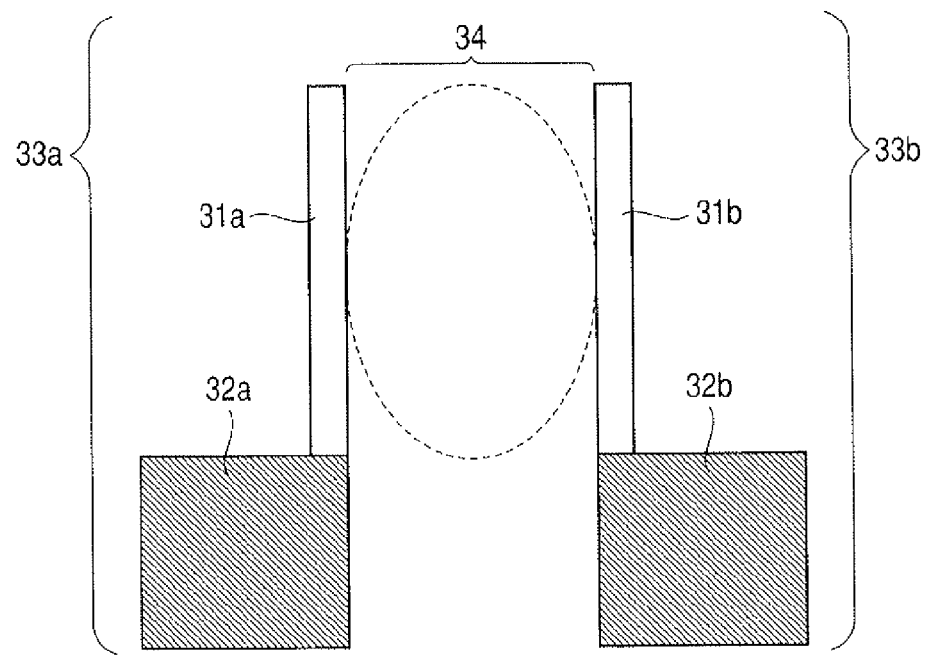
FIG. 2B is a plane view illustrating a detail of a conductive portion of a modification of the photoconductive device according to Example 1.

As an example of a different shape of the conductive portion, there are conductive portions 33a and 33b having electric supply portions 31a and 31b and electrode portions 32a and 32b, as shown in FIG. 2B. This is referred to as so called strip-line type. The electric supply portions 31a and 31b by themselves also function as the antenna portion. A spacing 34 between the electric supply portions 31a and 31b is typically 20 µm to 100 µm, but may be several mm.

Conductive portions 41a and 41b having an electrode portion as shown in FIG. 2C are also usable. The shape of the conductive portion as shown here is referred to as trapezoidal type. In such type, the conductive portions 41a and 41b by themselves also function as the electric supply portion, the antenna portion. A spacing 42 between the conductive portions 41a and 41b may also range from 20 µm to several mm.

The following descriptions refer again to FIGS. 1A, 1B and FIG. 2A. The site forming the gap 15 where the conductive portions 14a and 14b are closest to each other corresponds to the antenna portions 21a and 21b. In a dipole antenna as shown in FIG. 2A, the antenna portions 21a and 21b have a spacing of typically about 5 µm. A pulsed laser with pulse time width of about 100 fs is applied to the gap 15 which is the gap of the antenna portions 21a and 21b, and a voltage having about 10 V to about 100 V is applied between the first and second antenna portions 21a and 21b, so that a terahertz wave is generated. In FIG. 2A and the like, such light irradiation region is shown by a broken line. The optical switch portion such as the photoconductive portion 12 is a part for generating carriers by excitation light incident from outside. With pulsed light used as the excitation light, this excitation light instantly causes the optical switch portion to be in continuity. An important thing here is not photo-excited carriers having short lives, but abrupt generation of carriers. As the excitation light, continuun light with a difference frequency of lights from two light sources (the continuun light itself is modulated at a frequency in the terahertz range) may be used.

The part where the conductive portions 14a and 14b are closest to each other and excitation light such as laser light is applied can be considered to be the antenna portion. In the present embodiment, two antenna portions are provided on the same face side of the optical switch portion. However, as in Example shown in FIG. 8D described later, two antenna portions may be provided on mutually different face sides across the optical switch portion.

In the present embodiment, the high resistance portion 13 is provided in a contacting manner so as to cover a part of surface of the photoconductive portion 12 and to be in contact therewith. This high resistance portion 13 may be made by using a technique such as a photolithography. The first conductive portion 14a is provided on the high resistance portion 13 while being in contact therewith. The other second conductive portion 14b is provided on the photoconductive portion 12 while being in contact therewith. However, a part of the conductive portion 14a may be provided on the photoconductive portion 12 while being in contact therewith. Moreover, a part of the conductive portion 14b may be in contact with the high resistance portion 13. However, it is necessary to satisfy the following conditions. That is, the first antenna portion 21a within the first conductive portion 14a is not in contact with the photoconductive portion 12. Moreover, at least a part of the second antenna portion 21b within the second conductive portion 14b is always in contact with the photoconductive portion 12. In particular, the part of the second conductive portion 14b that is closest to the first conductive portion 14a is desirably provided on the photoconductive portion 12 while being in contact therewith.

As described above, applying a voltage of about 10 V to about 100 V between the first and second conductive portions 14a and 14b and irradiating the gap between the antenna portions 21a and 21b with a pulsed laser or the like generate a terahertz wave. Then, with the presence of the high resistance portion 13, the electric resistance between the first and second antenna portions 21a and 21b is increased. The high electric resistance suppresses steady excessive current. Therefore, this increases the withstanding voltage, enabling application of a higher voltage. On the other hand, since the antenna portion 21b is in contact with the photoconductive portion 12, implantation of carriers is performed. Irradiation of the pulsed laser or the like causes carriers to be momentarily moved and accelerated in the photoconductive portion 12 by the electric field between the antenna portions 21a and 21b to generate a terahertz wave. As a result of a high withstanding voltage, a more intensive terahertz wave can be generated.

In the present invention including the present embodiment, the substrate 11 and the high resistance portion 13 may also be of different materials. Therefore, materials suitable for each of them may be selected independently.

A consideration is made on, for example, the use of an erbium-doped fiber laser as a pulsed laser light source. In such case, laser light has a wavelength of about 1.5 μm. Therefore, the photoconductive portion which is the optical switch portion often includes low-temperature-grown indium gallium arsenide (LT-InGaAs) having a band gap of 0.74 eV rather than LT-GaAs described above. LT-InGaAs has a lower electric resistance than that of LT-GaAs. Therefore, the maximum voltage capable of being applied to LT-InGaAs is lower than that of LT-GaAs. For this reason, compared to the case where LT-GaAs is used, the maximum terahertz wave intensity that can be generated is low. However, according to the present invention including the present embodiment, even in such case, the provision of the resistance portion can increase the maximum application voltage and improve the maximum terahertz wave intensity. Moreover, such provision also allows use of a substrate having less absorption of the generated terahertz wave, further improving the maximum terahertz wave intensity.

In connection with this, "68th Autumn Meeting of The Japan Society of Applied Physics, 6p-ZB-10 (2007)" discusses a method for producing a photoconductive antenna by forming an InGaAs thin film on a semi-insulating InP substrate through epitaxial growth, removing a half of this InGaAs thin film, and forming two electrodes thereon. Here, the electrodes are formed such that the gap where two electrodes are closest to each other crosses the boundary between the InGaAs thin film and the exposed semi-insulating InP substrate. This method intends to increase the withstanding voltage of a photoconductive antenna, and generate a more intensive terahertz wave. However, since this method does not use both a substrate and a resistance portion, these elements cannot be formed of different materials.

EXAMPLES

The present invention is described below with a more particular Example.

Example 1

As shown in FIGS. 1A and 1B, in Example 1, a semi-insulating (SI-) InP substrate is used as the substrate 11. Further, an InGaAs thin film, formed on the SI-InP substrate 11 by epitaxial growth at about 250° C., is used as the photoconductive portion 12. Then, to adjust (increase) electric resistance, the InGaAs thin film 12 may be doped with Be in a concentration of about $10^{17}$ to about $10^{18}$ cm$^{-3}$. The high resistance portion 13 is formed of a silicon nitride thin film or the like. The silicon nitride thin film 13 desirably has a thickness of less than 200 nm in order to obtain a moderate electric resistance. Moreover, the silicon nitride thin film 13 favorably has a higher resistance than the InGaAs thin film 12.

As shown in FIGS. 1A and 1B, the silicon nitride thin film 13 is formed so as to cover half of InGaAs thin film 12 by using plasma CVD, a photolithography, a dry etching method or the like. Subsequently, first and second conductive portions 14a, 14b formed by laminating titanium and gold in the total thickness of about 300 nm are formed by using a photolithography, a vacuum deposition method and the like. In the present example, the first conductive portion 14a is formed on the silicon nitride thin film 13 so as to be in contact therewith, and the second conductive portion 14b is formed on the InGaAs thin film 12 so as to be in contact therewith. The gap between the antenna portions 21a and 21b as shown in FIGS. 1A, 1B and 2A is about 5 μm, as an example, where this gap portion is regarded as a gap 15.

As shown in FIG. 2A, the electric supply portions 22a and 22b are disposed as wiring for connecting the electrode portions 23a and 23b to the antenna portions 21a and 21b. With the electric supply portions 22a and 22b disposed in parallel, the distance between the two (in the case of particularly considering its line width, the nearest neighbor distance to each other) may be referred to as antenna length. In the present example, the antenna length is 30 μm. Moreover, the width of the electric supply portions 22a and 22b is 10 μm, for example. The length of the electric supply portions 22a, 22b is 3 mm, for example. The electrode portions 23a, 23b are formed is a square having sides of about 500 μm length, for example. Note that in all of the figures, for easy viewing, the dimensions of each part are not necessarily those equally enlarging the dimensions of parts of an actual device, and the ratio of dimensions of each part does not necessarily exactly correspond to the ratio of parts of an actual device.

Figure 3A:
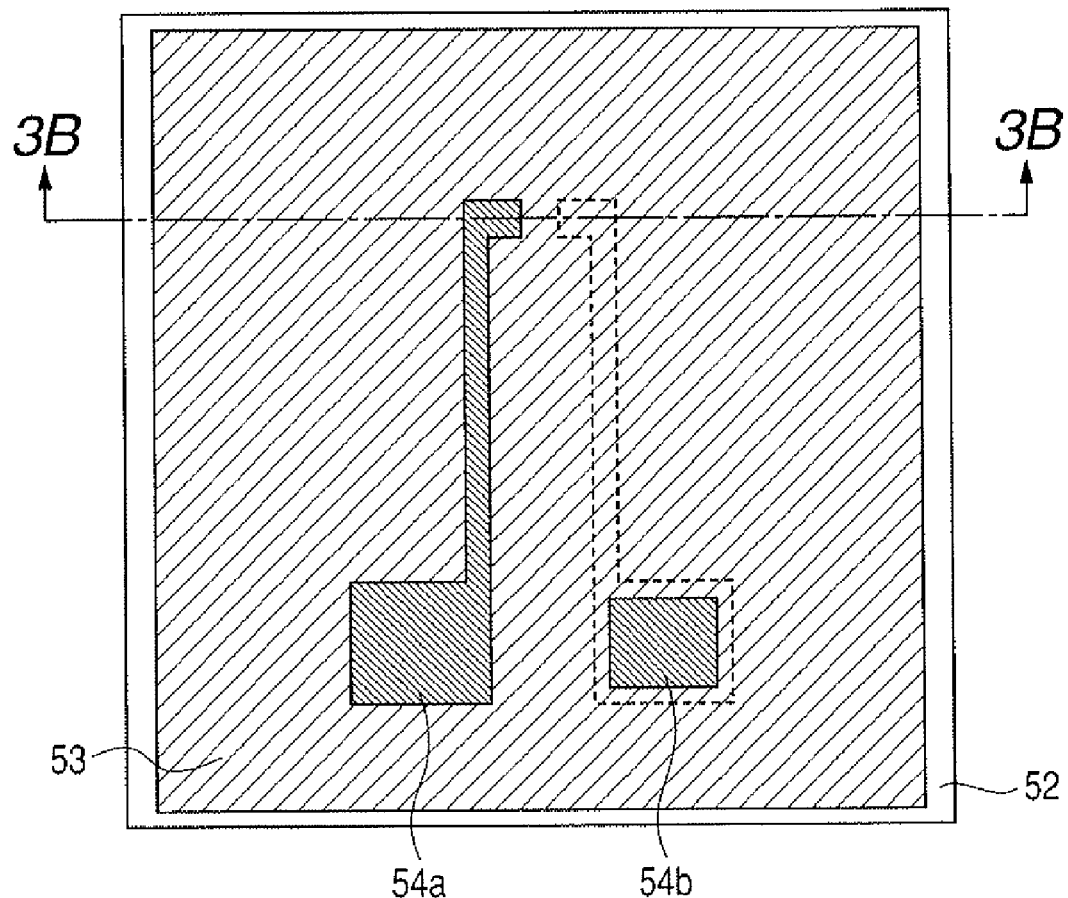
FIG. 3A is a plane view illustrating a modification of the photoconductive device according to Example 1 and Example 2.
Figure 3B:
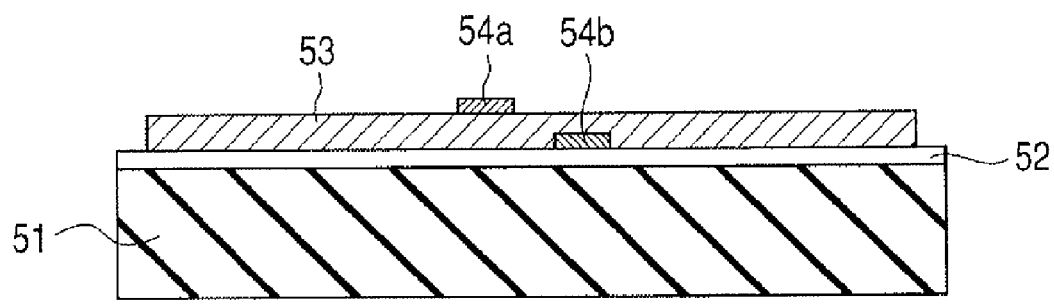
FIG. 3B is a cross section view of the photoconductive device illustrated in FIG. 3A.

A silicon nitride thin film as the high resistance portion and a conductive portion may have positional relationship as shown in FIG. 3A and FIG. 3B which is a cross section view taken along line 3B-3B of FIG. 3A. Thus, such thin film and conductive portion may have such a form that a first conductive portion 54a is on a high resistance portion 53 without being in contact with a photoconductive portion 52, while a second conductive portion 54b is under the high resistance portion 53 and in contact with the photoconductive portion 52 on a substrate 51. In such case, the first and second conductive portions 54a, 54b are made separately. Moreover, to obtain electrode contact, a part of silicon nitride thin film 53 on the second conductive portion 54b (the site of an electrode portion of the second conductive portion 54b) is removed. In the configurations of FIGS. 3A and 3B, the second conductive portion 54b is covered with the silicon nitride thin film 53. Therefore, this configuration has advantages of being able to prevent metal atoms from migrating, and suppress electromigration.

Figure 3C:
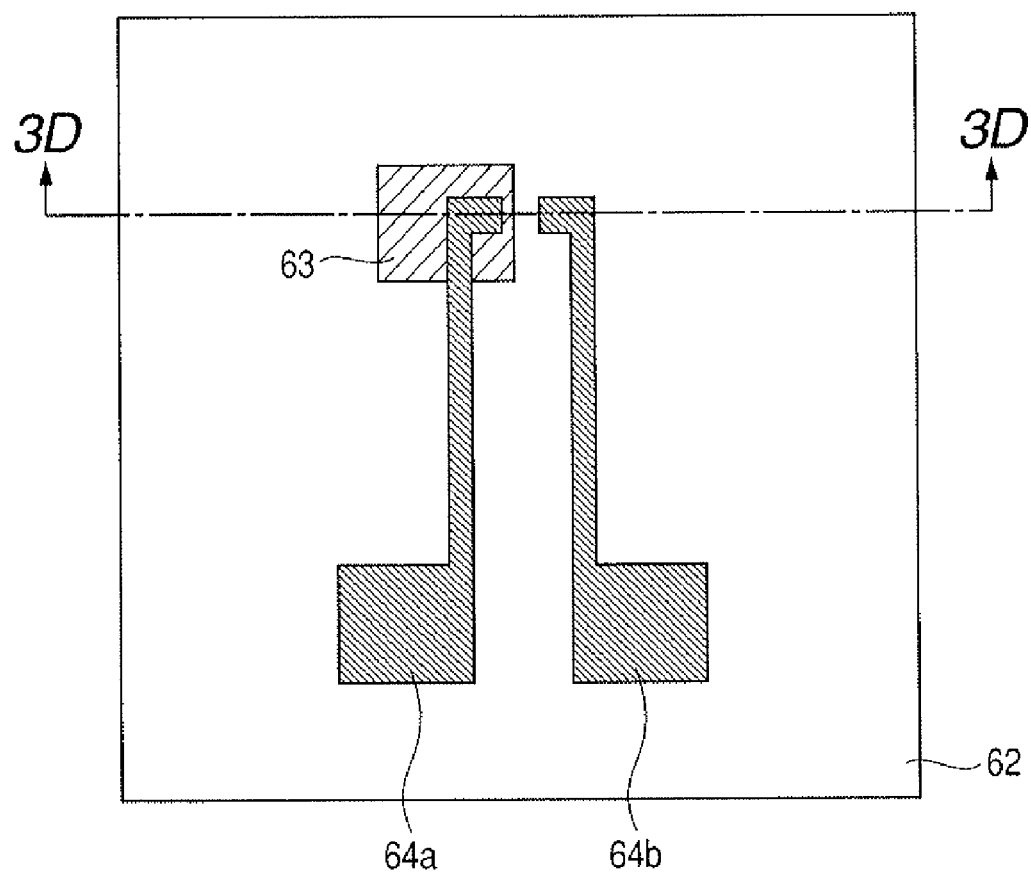
FIG. 3C is a plane view illustrating another modification of Example 1.
Figure 3D:
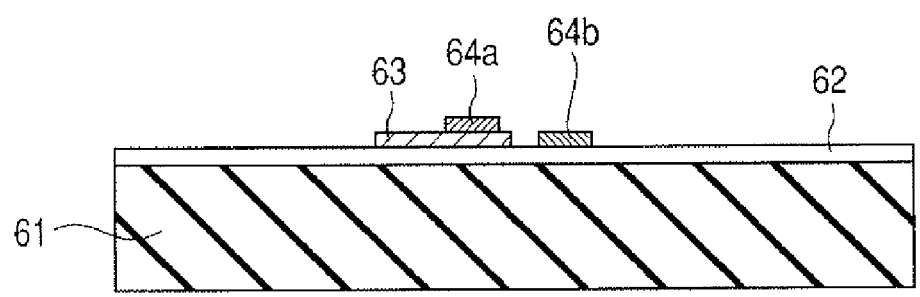
FIG. 3D is a cross section view of the modification illustrated in FIG. 3C.

The high resistance portion and the conductive portion may have positional relationship as shown in FIG. 3C, and FIG. 3D which is a cross section view taken along line 3D-3D of FIG. 3C. Thus, a part of a first conductive portion 64a (an antenna portion that is closest to a second conductive portion 64b) is on a high resistance portion 63 and is not in contact with a photoconductive portion 62 on a substrate 61, and the other part of the first conductive portion 64a (electric supply portion, electrode portion) is on the photoconductive portion 62 being in contract therewith. On the other hand, the whole second conductive portion 64b including an antenna portion that is closest to the first conductive portion 64a is in contact with the photoconductive portion 62.

Figure 4A:
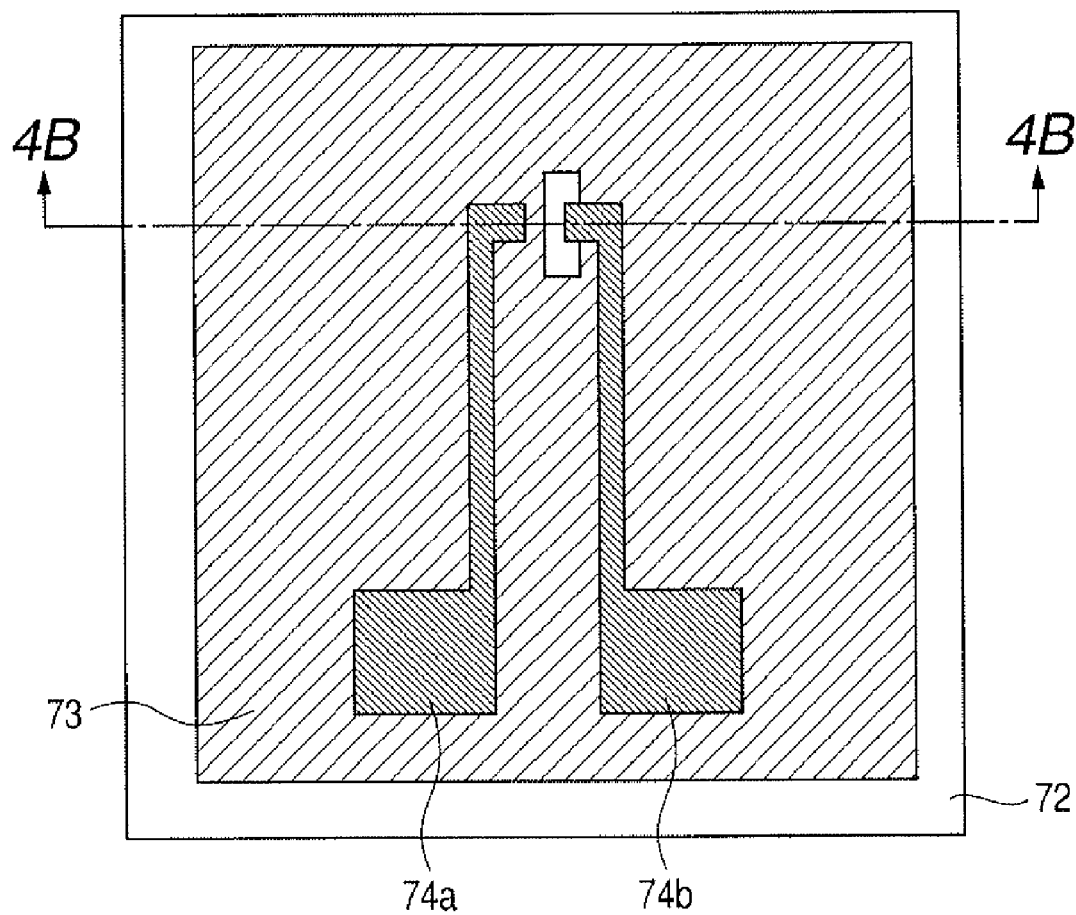
FIG. 4A is a plane view illustrating another modification according to Example 1.
Figure 4B:
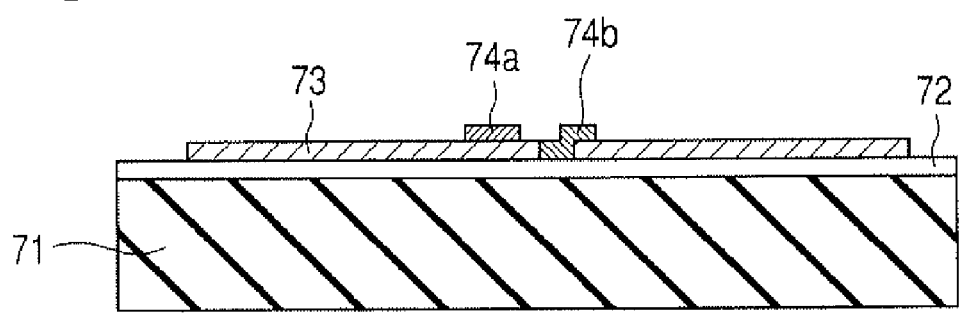
FIG. 4B is a cross section view of the modification illustrated in FIG. 4A.

The high resistance portion and the conductive portion may have positional relationship as shown in FIG. 4A, and FIG. 4B which is a cross section view taken along line 4B-4B of FIG. 4A. Thus, the whole first conductive portion 74a is on a high resistance portion 73 and is not in contact with a photoconductive portion 72 on a substrate 71. On the other hand, in a second conductive portion 74b, only a part including an antenna portion that is the closest to the first conductive portion 74a is in contact with the photoconductive portion 72, but the other part is on the high resistance portion 73.

Even in any configurations in FIGS. 1A, 1B, FIGS. 3A to 3D and FIGS. 4A to 4B described above, a silicon nitride thin film, which is the high resistance portion, increases the withstanding voltage. In addition, since one conductive portion is in contact with InGaAs which is the photoconductive portion, this configuration allows performing carrier implantation. Therefore, this configuration can accelerate carriers, while suppressing steady-state current, thereby improving the withstanding voltage of the device. Accordingly, a more intensive terahertz wave can be generated.

Figure 5A:
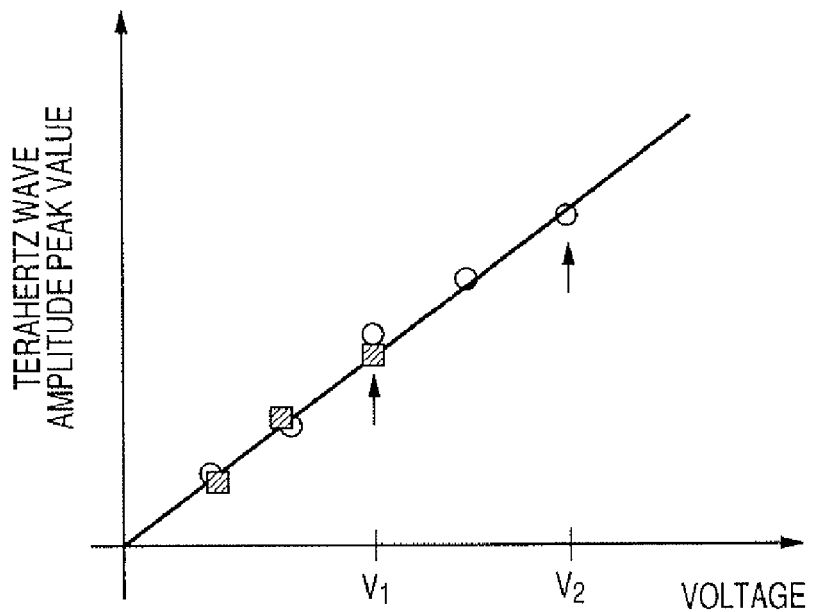
FIG. 5A is a schematic view describing a terahertz wave intensity in Example 1 as compared to a conventional example.

In order to clarify an advantage according to the present invention including the present example, FIG. 5A schematically illustrates how the intensity of a generated terahertz wave changes by comparing a terahertz wave generating device of the present invention (the present example, particularly examples in FIGS. 1A and 1B) with a conventional terahertz wave generating device. In FIG. 5A, plotting is made with the horizontal axis showing voltages applied between the conductive portions, and the vertical axis showing amplitude peak values of generated terahertz waves. The amplitude peak value of a terahertz wave is obtained by acquiring the time waveform of a terahertz wave such as the so-called time-domain spectroscopy.

Figure 10A:
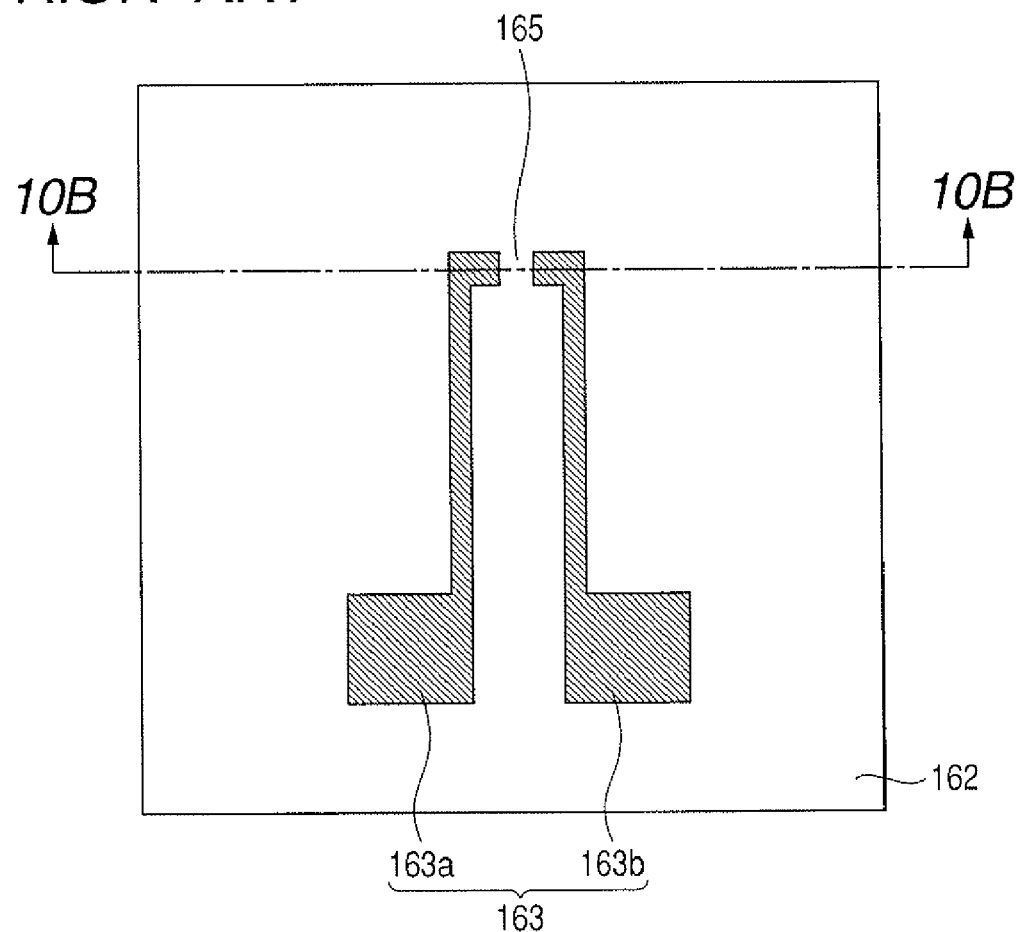
FIG. 10A is a plane view illustrating a photoconductive device disclosed in the prior art.
Figure 10B:
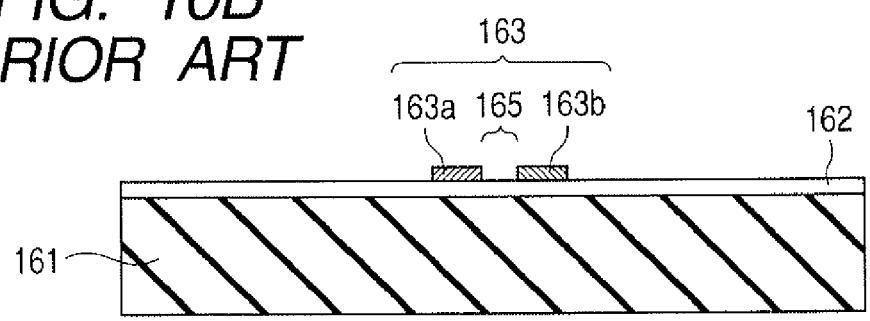
FIG. 10B is a cross section view of the photoconductive device illustrated in FIG. 10A.

Solid squares in FIG. 5A illustrate terahertz wave amplitude peak values according to the terahertz wave generating devices in FIGS. 10A and 10B, and white circles illustrate a terahertz wave amplitude peak value according to a terahertz wave generating device of the present example. In both devices, the material of the substrates and the photoconductive portions as well as the material and shape of the conductive portions are the same. Moreover, the limit voltage at which the terahertz wave generating device in FIGS. 10A and 10B is damaged is $V_1$ and the limit voltage at which the terahertz wave generating devices of the present example is damaged is $V_2$. As can be seen from FIG. 5A, in both terahertz wave generating devices of the present example and FIGS. 10A and 10B, the slopes of the graph are nearly equal. However, as a result of $V_1<V_2$, the terahertz wave generating device of the present example may generate a more intensive terahertz wave than that of FIGS. 10A and 10B.

As above, according to the photoconductive device of the present example, the resistance between the antenna portions of the first and second conductive portions, which are separated by the gap, may be increased. This makes them be able to withstand a higher voltage, thereby allowing a higher voltage to be applied between two conductive portions. Thus, the maximum intensity of an obtained terahertz wave can be increased.

Example 2

Example 2 of the present invention is described. In the present example, a mixture in which a small amount of metal particles are mixed in a dielectric is used as the high resistance portion in the terahertz wave generating device that has been described in Example 1.

Example 2 is described by using reference numerals given to the structure shown in FIGS. 3A and 3B. For example, $MgF_2$ is deposited on the photoconductive portion 52 and subsequently gold is deposited thereon to about 10 nm. When the gold is about 5 nm to about 10 nm, a so-called island structure is formed rather than a uniform thin film. In island structures, striped gold clusters are formed in various places. Again, a series of the following steps are repeated: $MgF_2$ is deposited again; and gold is deposited thereon to about 5 nm to about 10 nm. Such repetition results in the formation of network in $MgF_2$ where gold clusters are connected. Therefore, an object having moderate electric conductivity is formed. Its resistivity may be selected by controlling the amount of $MgF_2$ and the amount of gold. Therefore, the high resistance portion 53, having a resistance higher than that of the photoconductive portion 52 and appropriate resistivity, may be made. The rest is the same as Example 1.

Example 3

Figure 4C:
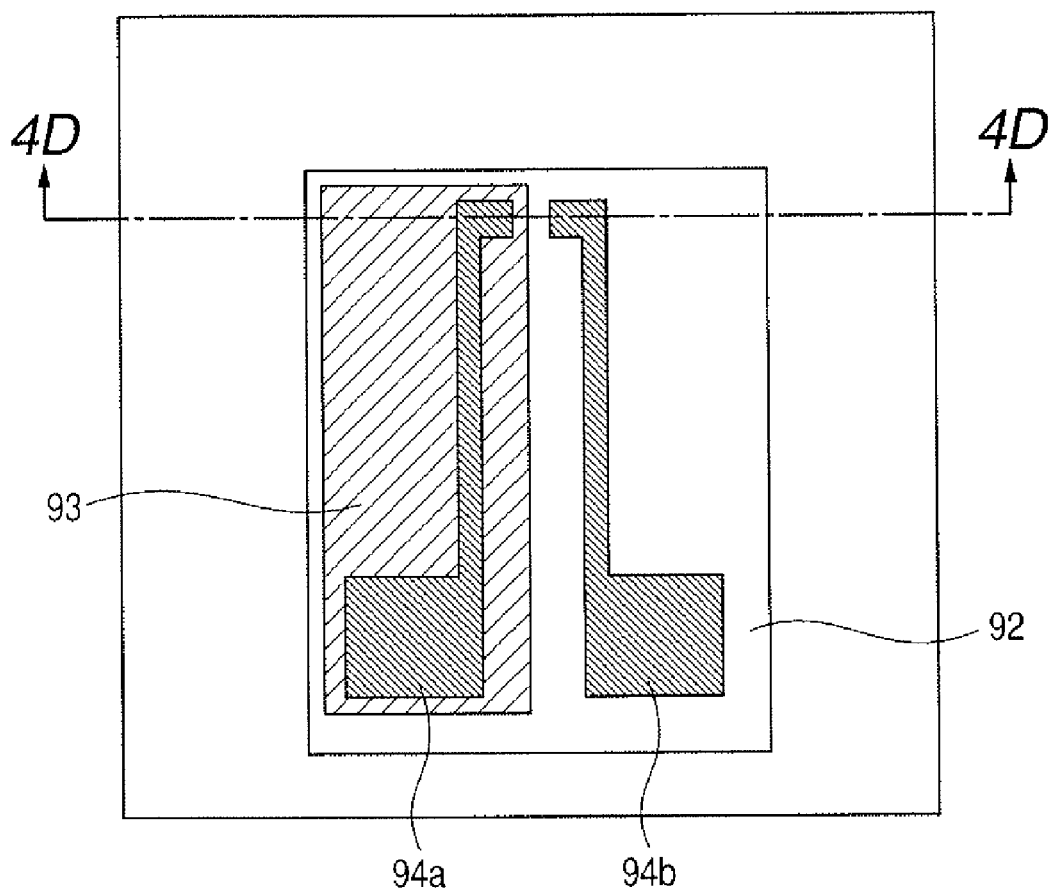
FIG. 4C is a plane view illustrating a thin-film transfer technology that is a method for producing a photoconductive device according to Example 3.
Figure 4D:
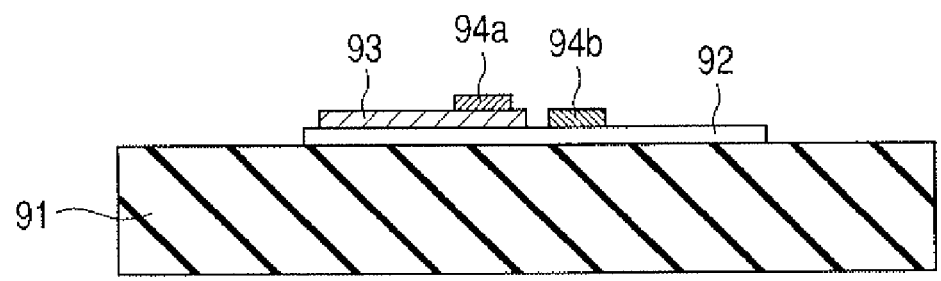
FIG. 4D is a cross section view of the thin-film transfer technology illustrated in FIG. 4C.

Example 3 of the present invention is described with reference to FIGS. 4C and 4D. A terahertz wave generating device which is a photoconductive device of the present example as shown in FIG. 4C and FIG. 4D which is a cross section view taken along line 4D-4D of FIG. 4C includes a substrate 91, a photoconductive portion 92, a high resistance portion 93, and first and second conductive portions 94a and 94b. The photoconductive portion 92 is provided in contact with at least a part of the upper surface of the substrate 91. The photoconductive portion 92 is not formed by a crystal growth on the substrate 91 but a thin film formed by a crystal growth on another substrate and attached onto the substrate 91. Thus, the photoconductive portion 92 employs a so-called thin-film transfer technology.

The material of the substrate 91 has a high transmittance for a terahertz wave. Such materials, for example, include high resistance silicon, quartz, polyethylene, polystyrene, fluorine-containing resin, polyolefin and sapphire. An adhesive for bonding the substrate 91 and the photoconductive portion 92 may be present between them (not shown).

In the photoconductive portion 92, used is the same material as one described in Example 1. Also, the materials of the high resistance portion 93 and the conductive portions 94a and 94b are the same as those described in Example 1. The positional relationship of the high resistance portion 93 and the first and second conductive portions 94a and 94b are also the same as the positional relationship of Example 1, as shown in FIGS. 4C and 4D.

Figure 6A:
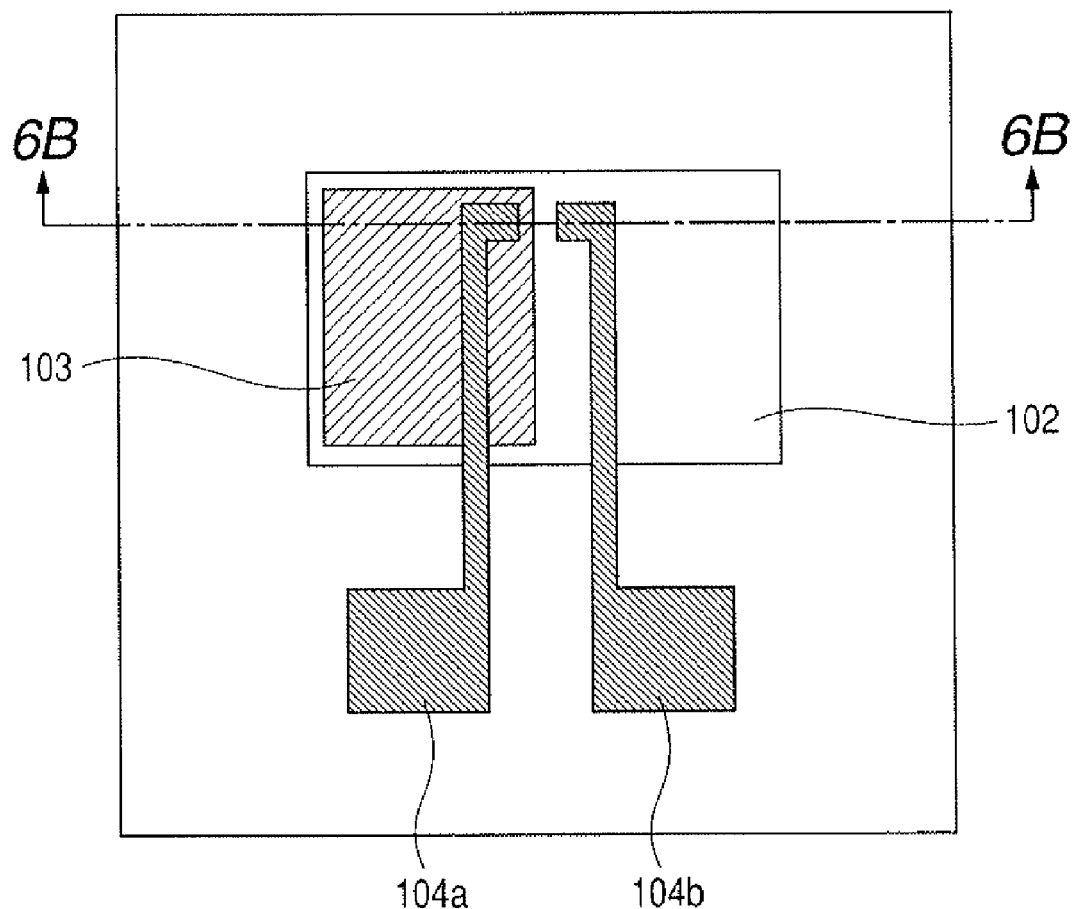
FIG. 6A is a plane view illustrating a modification of Example 3.
Figure 6B:
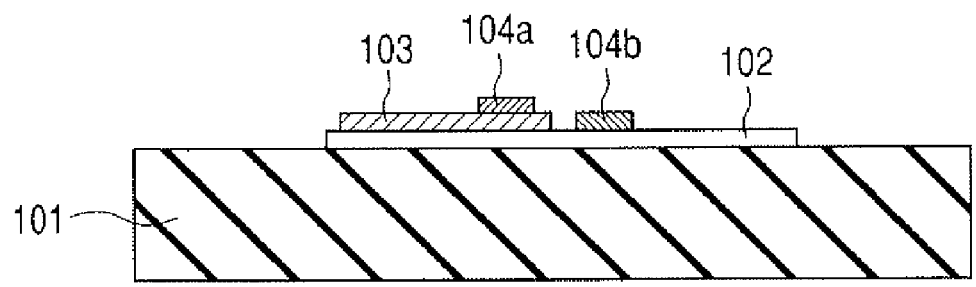
FIG. 6B is a cross section view of the modification illustrated in FIG. 6A.

As shown in FIG. 6A and FIG. 6B which is a cross section view taken along line 6B-6B of FIG. 6A, first and second conductive portions 104a and 104b may extend onto the substrate 101. However, in such case, the substrate 101 is desirably an insulator or semi-insulating substrate. Even when the substrate 101 is not an insulator, it is sufficient to have such a configuration that the conductive portions 104a and 104b are not in contact with the substrate 101. For example, it is only necessary to function as an insulator by such a configuration that an adhesive (not shown) used for bonding the substrate 101 and a photoconductive portion 102 covers the entire surface of the substrate 101, and the adhesive intervenes between the conductive portions 104a and 104b and the substrate 101.

In the configuration of the present example, the material of the substrate 91 or 101 having high transmittance for a terahertz wave as well as the material of the high resistance portion 93 or 103 which moderately increases resistance between the conductive portions 94a and 94b or 104a and 104b can be chosen independently of each other. As a result, a more intensive terahertz wave can be generated. The configuration shown in FIGS. 6A and 6B has a cost advantage since the amount of use of the photoconductive portion 102 can be reduced. The rest is the same as Example 1.

Example 4

Example 4 is described. The present example involves a specific production method of Example 3. The production method of the present example is described with reference to FIGS. 7A to 7E.

In FIGS. 7A to 7E, a photoconductive portion 112 of a GaAs thin film is formed by epitaxial growth on a GaAs substrate 111 at a temperature of about 250° C. A high resistance portion 113 is, for example, a silicon dioxide thin film and is provided so as to cover a part of the GaAs thin film 112 to be in contract therewith. First and second conductive portions 114a and 114b are titanium and gold laminated in a total amount of about 300 nm. The first conductive portion 114a is provided on the silicon dioxide 113 in contract therewith. The second conductive portion 114b is provided on the GaAs thin film 112 in contract therewith. The site where the first and second conductive portions 114a and 114b are closest to each other sandwich the boundary of the silicon dioxide thin film 113. The stage of FIG. 7A is as described above.

As show in FIG. 7B, a glass substrate 116 and the like are temporarily bonded with a soluble adhesive 115 on the side where the conductive portions 114a and 114b are present (on the upper side of the GaAs substrate 111). The adhesive 115 may be, for example, a photoresist or the like.

As shown in FIG. 7C, the substrate 111 is removed by mechanical polishing, wet etching and the like. In the present example, the substrate 111 and the photoconductive portion 112 are of the same material of GaAs. Therefore, in order to enable selective wet etching, a sacrifice layer 117 (AlAs) is desirably placed between the substrate 111 and the photoconductive portion 112 (see, FIG. 7A).

Subsequently, as shown in FIG. 7D, a polyolefin substrate 118 is bonded on the lower side of the photoconductive portion 112. An insoluble epoxy-based adhesive (not shown) or the like may be used for adhesion. As shown in FIG. 7E, a soluble adhesive 115 is removed by an organic solvent or the like to remove the glass substrate 116. In this way, the terahertz wave generating device with the configuration as shown in FIGS. 4C, 4D is made.

The operation of a terahertz wave generating device made by the production method of the present example is described. As in the above Example 1, a voltage having about 10 V to about 100 V is applied between the first and second conductive portions 114a and 114b, and the GaAs thin film 112 in the site where the first and second conductive portions are closest to each other (the gap between the first and second conductive portions) is irradiated with a pulsed laser to generate a terahertz wave. Then, since the silicon dioxide thin film 113 has a sufficiently thin thickness and sufficiently high transmittance for a pulsed laser, the GaAs thin film 112 under the silicon dioxide thin film 113 can be irradiated.

Polyolefin generally has high transmittance for a terahertz wave. In the present example, the withstanding voltage is increased by a silicon dioxide thin film 113, and an intensive terahertz wave which is generated by applying a higher voltage is emitted outside without being attenuated in the substrate 111.

Figure 5B:
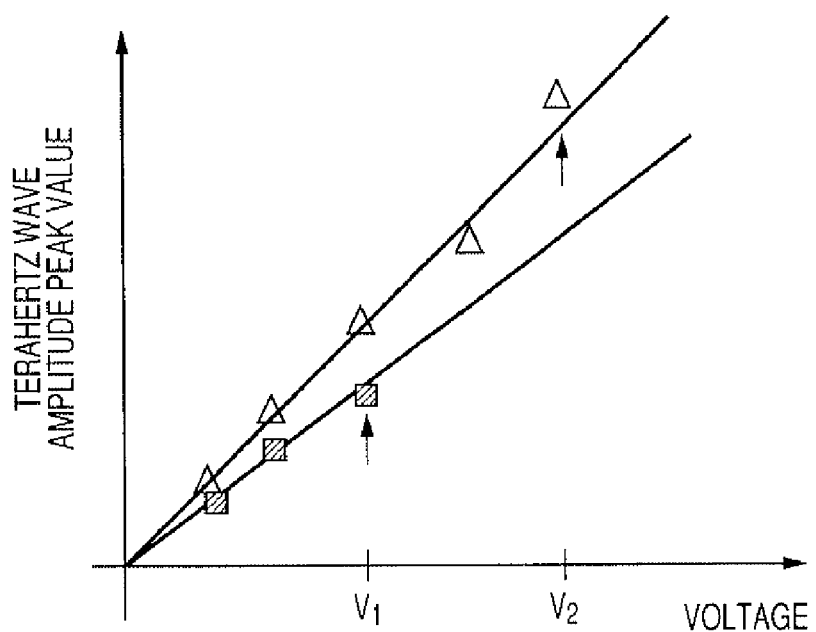
FIG. 5B is a schematic view describing a terahertz wave intensity in Example 3 or the like as compared to a conventional example.

In order to clarify an advantage according to the present invention including the present example, FIG. 5B illustrates a schematic graph illustrating how the intensity of a terahertz wave to be generated changes by comparing a terahertz wave generating device of the present invention (the present example, particularly examples in FIGS. 4C and 4D) with the conventional terahertz wave generating device (FIGS. 10A and 10B). In FIG. 5B, plotting is made with the horizontal axis showing voltages applied between the conductive portions, and the vertical axis showing amplitude peak values of generated terahertz waves. The amplitude peak value of a terahertz wave is obtained by acquiring the time waveform of a terahertz wave such as the so-called time-domain spectroscopy.

Solid squares in FIG. 5B illustrate terahertz wave amplitude peak values according to the terahertz wave generating device in FIGS. 10A and 10B, and white circles illustrate a terahertz wave amplitude peak value according to the terahertz wave generating device of the present example, where the material of the photoconductive portion as well as the material and shape of the conductive portions are the same, but the materials of the substrate 91 and a substrate 161 are different. As described above, the substrate 91 is cycloolefin, and the substrate 161 is semi-insulating GaAs.

The limit voltage at which the terahertz wave generating devices in FIGS. 10A and 10B is damaged is $V_1$ and the limit voltage at which the terahertz wave generating devices of the present example is damaged is $V_2$. As can be seen from FIG. 5B, the slopes of the graph of the present example is steeper than those of the terahertz wave generating devices in FIGS. 10A and 10B. This is because the terahertz wave generating device of the present example exhibits less attenuation of a terahertz wave in the substrate than the terahertz wave generating devices in FIGS. 10A and 10B. Moreover, $V_1<V_2$ is shown. Therefore, the terahertz wave generating device of the present example may generate a more intensive terahertz wave than that of FIGS. 10A and 10B.

Example 5

Figure 6C:
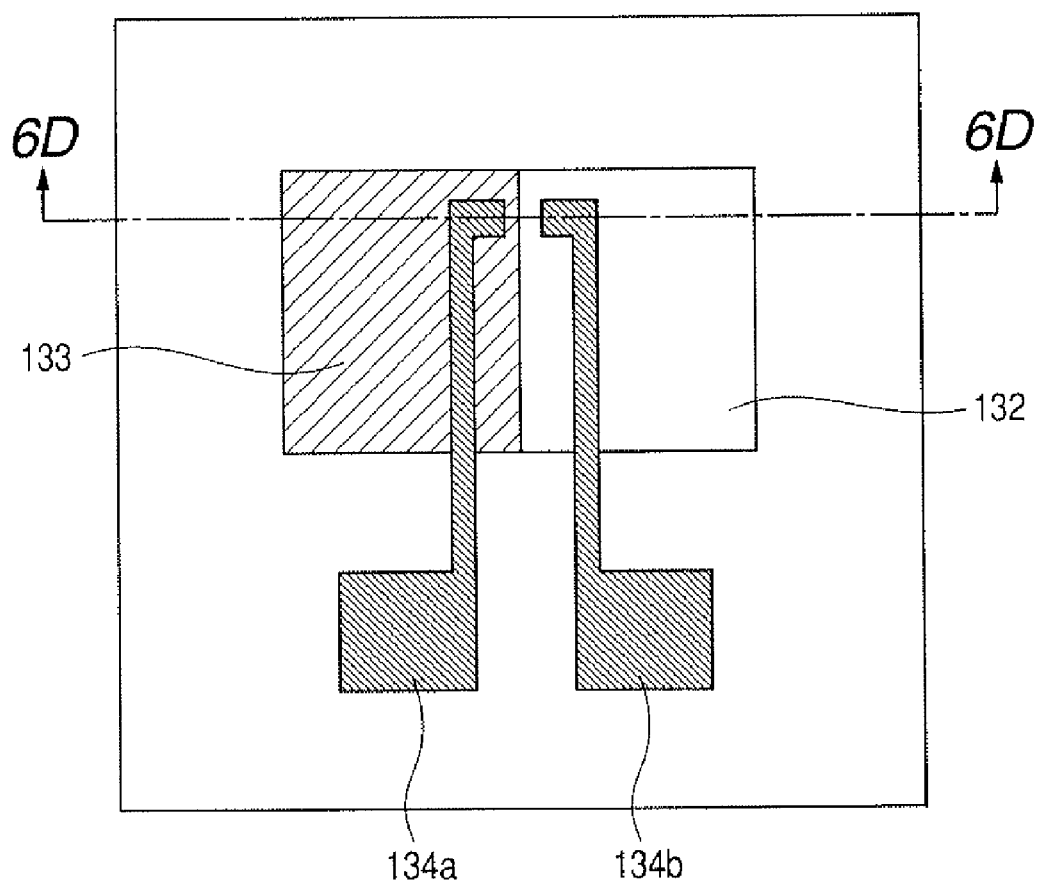
FIG. 6C is a plane view illustrating a photoconductive device according to Example 5.
Figure 6D:
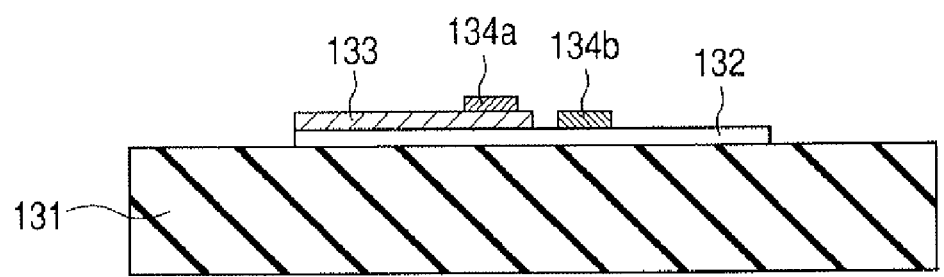
FIG. 6D is a cross section view of the photoconductive device illustrated in FIG. 6C.

Example 5 is described with reference to FIGS. 6C and 6D. A terahertz wave generating device shown in FIG. 6C and FIG. 6D which is a cross section view taken along line 6D-6D of FIG. 6C includes a substrate 131, a photoconductive portion 132, a high resistance portion 133, and first and second conductive portions 134a and 134b. Configurations of each part are the same as that of Example 1 or the like.

Figure 8A:
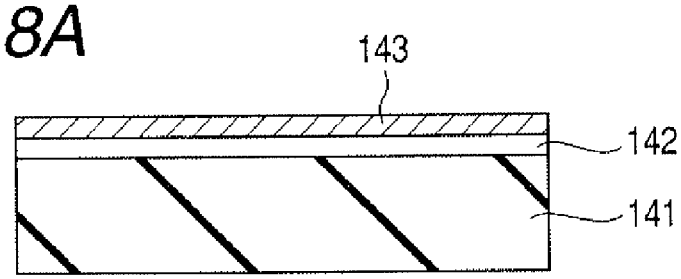
FIGS. 8A, 8B and 8C are schematic cross section views describing a method for producing photoconductive devices according to Examples 5 and 6.
Figure 8B:
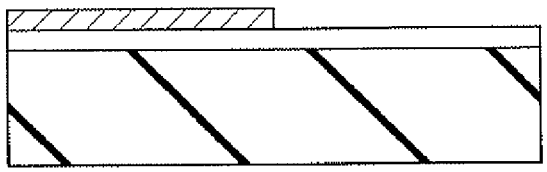
Figure 8C:
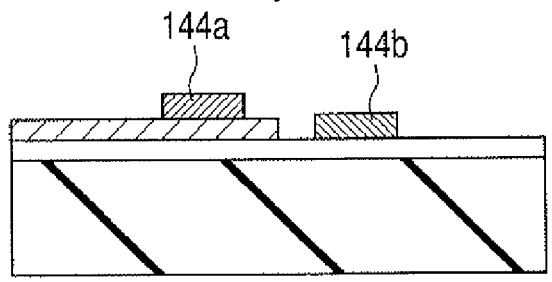

The present example differs from Example 1 or the like in that the high resistance portion 133 is a semiconductor film made on the photoconductive portion 132 by epitaxial growth. In the production method of the present example, as shown in FIGS. 8A to 8C, a photoconductive portion 142 is grown on a substrate 141 (this substrate does not necessarily have to be the same as the substrate 131 shown in FIGS. 6C and 6D) by epitaxial growth. Subsequently, a semiconductor film having a higher resistivity is formed on the photoconductive portion 142 as a high resistance portion 143 by epitaxial growth.

The photoconductive portion 142 is formed of Si, Ge, GaAs, As-implanted GaAs, InAs, ion-implanted Si, ion-implanted Ge, any of the group III-V compound semiconductors, any of the group II-VI compound semiconductors, an ion-implanted compound semiconductor, a low-temperature-grown compound semiconductor and the like. A material showing lattice-matching with the photoconductive portion 142 and having high resistance is used for the high resistance portion 143. Such materials include, for example, Si, Ge, GaAs, As-implanted GaAs, InAs, ion-implanted Si, ion-implanted Ge, any of the group III-V compound semiconductors, any of the group II-VI compound semiconductors, an ion-implanted compound semiconductor, a low-temperature-grown compound semiconductor, and the like.

The high resistance portion 143 may be formed of a material with a band gap energy larger than the energy corresponding to the wavelength of a pulsed laser used for generating a terahertz wave.

For example, an InP substrate is used as the substrate 141 to form InGaAs on the InP substrate 141 as the photoconductive portion 142 by epitaxial growth at a temperature of about 250° C. Subsequently, (undoped) InP with an impurity reduced as far as possible is grown as the high resistance portion 143.

Alternatively, a GaAs substrate is used as the substrate 141 to form GaAs on the GaAs substrate 141 as the photoconductive portion 142 by epitaxial growth at a temperature of about 250° C. Subsequently, (undoped) AlAs or AlGaAs with an impurity reduced as far as possible is formed as the high resistance portion 143 by epitaxial growth.

Subsequently, a part of the high resistance portion 143 is partly removed through a treatment such as etching to form first and second conductive portions 144a, 144b by a photolithography or the like. If desired, as shown in Example 3, transfer to another substrate may be performed (see Example 6 described below).

As described above, in the present example, the high resistance portion is formed on the optical switch portion including the photoconductive portion by a crystal growth. Thus, due to the successive epitaxial growth of the photoconductive portion 142 (or 132) and the high resistance portion 143 (or 133), a process for making the high resistance portion (such as plasma CVD) used in Example 1 or the like may be omitted. Moreover, during epitaxial growth of the high resistance portion 143 (or 133), regulating the doping amount of impurities and temperature thereof allows appropriate selection of the resistivity of the high resistance portion.

Example 6

Example 6 is described with reference to FIGS. 8A to 8C again. In the present example, an InP substrate is used as the substrate 141. On the InP substrate 141, an InGaAs thin film is formed to about 1.5 μm as the photoconductive portion 142 through crystal growth by a molecular beam epitaxial method at a temperature of 250° C. Subsequently, on the InGaAs thin film 142, an InP thin film is formed through crystal growth also by the molecular beam epitaxial method to obtain the high resistance portion 143. The InP thin film 143 should be of undoped InP which includes as few impurities as possible. For example, the impurity concentration in the InP thin film 143 is desirably $10^{15}$ cm$^{-3}$ or less, more desirably $10^{14}$ cm$^{-3}$ or less, and most desirably $10^{13}$ cm$^{-3}$ or less. On the contrary, a dopant (for example, Fe) which provides a so-called deep level may be provided by ion-implantation.

Then, a half of the InP thin film 143 is removed by wet etching or the like. Subsequently, titanium and gold is laminated to a total of about 300 nm as first and second conductive portions 144a, 144b. Their respective positional relationship at this time is the same as those of Example 1.

Subsequently, the InGaAs thin film 142, the InP thin film 143, and the first and second conductive portions 144a, 144b are integrally transferred to a polyethylene substrate as a substrate. The polyethylene substrate and the InGaAs thin film 142 may be bonded with an adhesive such as an epoxide resin.

In the present example, an InP thin film is used as the high resistance portion 143, the InP thin film showing lattice-matching with an InGaAs thin film which is the photoconductive portion 142. Therefore, the present example allows the photoconductive portion 142 and the high resistance portion 143 to be consistently produced to have a merit in cost advantage. Moreover, the resistivity of the high resistance portion 133 and the transmittance for a terahertz wave of the substrate 131 can be selected independently.

Thus, a method for producing a photoconductive device of the present example enables the photoconductive portion and the high resistance portion to be produced continuously and consistently to reduce cost and labor required for making them.

Example 7

Figure 8D:
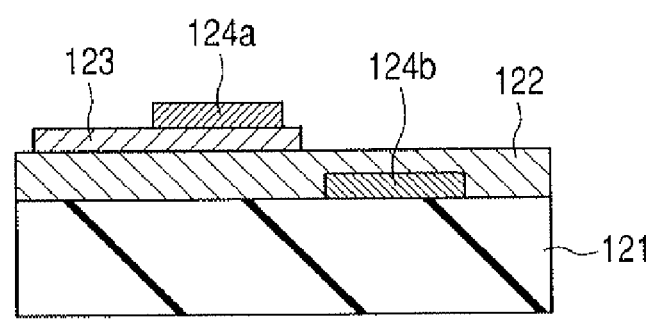
FIG. 8D is a cross section view describing a photoconductive device according to Example 7.

Example 7 of the present invention is described with reference to FIG. 8D. A terahertz wave generating device which is a photoconductive device of the present example as shown in FIG. 8D includes a substrate 121, a photoconductive portion 122, a high resistance portion 123, and first and second conductive portions 124a, 124b. The second conductive portion 124b is provided on the substrate 121, and the photoconductive portion 122 is provided thereon in contract therewith. Moreover, the high resistance portion 123 is provided on the photoconductive portion 122, and the first conductive portion 124a is provided thereon in contract therewith. Thus, in the present example, first and second conductive portions 124a, 124b are provided so as to sandwich the photoconductive portion 122. The rest is the same as Example 1.

The photoconductive device of the present example also can increase the resistance between the antenna portions of the first and second conductive portions, which are separated by the gap. Therefore, this enables to withstand a higher voltage, and apply a higher voltage between two conductive portions, and increase the obtainable maximum intensity of a terahertz wave.

In the photoconductive portion of the above Example, for example, a p-type GaAs film and an n-type GaAs film may also be laminated on both sides of the photoconductive film to form a PIN structure. In such case, a p-type or n-type structure may be made by doping.

Example 8

Example 8 according to a terahertz wave apparatus using the terahertz wave generating apparatus of the present invention is now described with reference to FIG. 9. The terahertz wave apparatus acquires terahertz wave spectral information or a terahertz wave image of an inspection object, or both of them.

Figure 9:
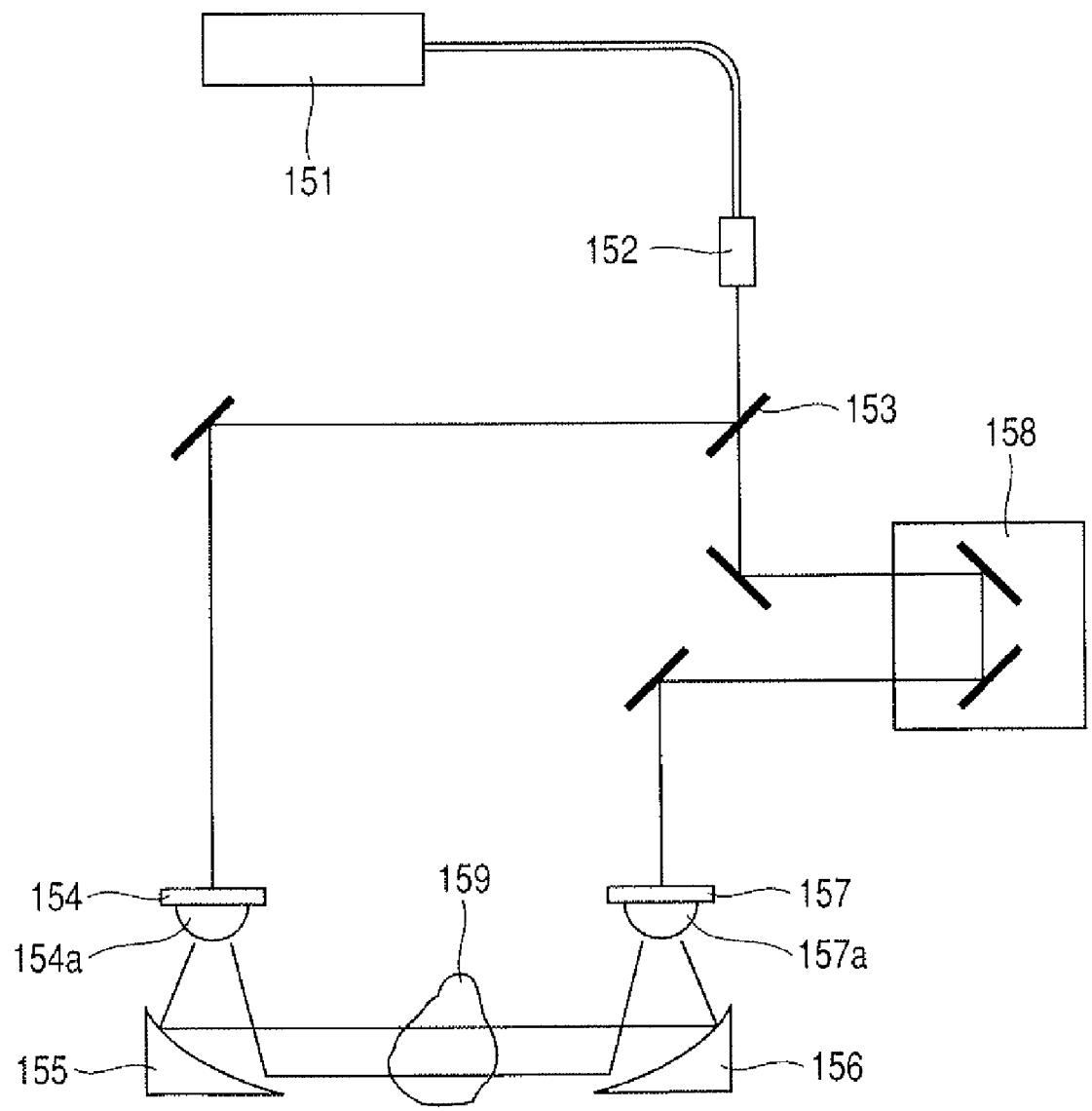
FIG. 9 is a schematic view describing Example 8.

In FIG. 9, laser light emitted from an ultrashort pulsed laser light source 151 is split into two beams at a beam splitter 153. The ultrashort pulsed laser light source 151 uses a mode-locked titanium sapphire laser, a mode-locked erbium-doped fiber laser and the like. Its pulse time width is typically about 10 fs to 1 ps. In the configuration of FIG. 9, a mode-locked erbium-doped fiber laser is described as an example, in which laser light is emitted to a space at a coupler 152.

A photoconductive device 154 is in any form of the above Examples. One beam of the split laser light is condensed and applied to the gap of the antenna portion of such photoconductive device 154 to generate a terahertz wave. A hemispherical lens 154a may be used such that the generated terahertz wave is efficiently emitted to a space. Such lens is made of a dielectric having a dielectric constant comparable to that of the substrate of the photoconductive device 154. For example, a hemispherical lens made of high resistance Si is used. In this way, here, a terahertz wave generating apparatus includes the photoconductive device 154, the above irradiation portion for irradiating the gap region with excitation light, and a voltage applying portion for applying a bias voltage between two conductive portions which are divided by the gap.

An emitted terahertz wave is caused to enter from its back side to the photoconductive device 157 via the parabolic mirror 155, the object to be inspected 159, the parabolic mirror 156. The photoconductive device 157 may be a photoconductive device in any form of the above Examples, or a conventional photoconductive device.

The other beam of the laser light split at the beam splitter 153 is condensed and applied to the gap of an antenna portion of the photoconductive device 157 via a time delay device 158. When laser light and a terahertz wave are coincidentally entered into the photoconductive device 157, a terahertz wave can be detected. Moreover, with a time delay device 158, by changing an incident timing of a terahertz wave and laser light entering the photoconductive device 157, the time waveform of a terahertz wave can be obtained. This is a technique referred to as so-called time-domain spectroscopy, which is used for spectroscopy of the terahertz waveband. In other word, spectroscopy of an object to be inspected 159 in terahertz waveband may be performed. Thus, terahertz wave spectral information or a terahertz wave image of an inspection object, or both of them can be acquired. Of course, a terahertz wave may be detected by only the intensity or amplitude with an electrooptical crystal, a bolometer and the like.

Moreover, four parabolic mirrors, or alternatively two elliptical mirrors instead of the parabolic mirrors, are used to condense and apply a terahertz wave onto the object to be inspected 159, detect a transmitted terahertz wave, and scan the object to be inspected 159. This also can obtain a terahertz wave transmission image of the object to be inspected 159.

Conventionally, apparatuses which use a mode-locked erbium-doped fiber laser as a laser light source are of small sizes, but in a photoconductive device using LT-InGaAs with its band gap near the wavelength of the laser, applying a high voltage often causes damage to the device. For this reason, the apparatuses can only generate a weak terahertz wave, and therefore cannot help but sacrifice its spectroscopy accuracy to some extent instead of the downsizing of the apparatuses. On the other hand, with a mode-locked titanium sapphire laser used as the laser light source, photoconductive devices using LT-GaAs having its band gap near the wavelength of the laser may be used. These devices can apply a relatively high voltage, and therefore generate a more intensive terahertz wave compared to the case of using LT-InGaAs. However, the mode-locked titanium sapphire laser is several times as large as the mode-locked erbium-doped fiber laser, and requires precise handling.

In the present example, any device of the above Examples is used in the so-called terahertz wave time-domain spectroscopy described above. Thus, the present example also can apply a high voltage to a photoconductive device using LT-InGaAs device. Therefore, the size of the whole apparatus is reduced, and higher-accuracy spectroscopy can be feasible.

As described above, the terahertz wave apparatus of the present example can downsize the whole apparatus and provide higher-accuracy spectroscopy or imaging. Because this terahertz wave apparatus uses the photoconductive device of the present invention, and therefore can use materials which have difficulty in generating an intensive terahertz wave conventionally due to its low resistance, for the photoconductive portion. Accordingly, a pulsed laser light source used for generating and detecting a terahertz wave improves selectivity of wavelength, and even when a smaller pulsed laser light source such as a fiber laser is used, high-accuracy spectroscopy or imaging can be feasible.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-217851, filed Aug. 27, 2008, which is hereby incorporated by reference herein in its entirety.

What is claimed is:

1. A photoconductive device, comprising:
   a photoconductive portion for generating carriers by applied excitation light;
   a resistance portion in contact with the photoconductive portion;
   a first conductive portion in contact with the photoconductive portion; and
   a second conductive portion that is provided so as to have a gap with respect to the first conductive portion and is in contact only with the resistance portion at least around the gap.

2. The photoconductive device according to claim 1, wherein the resistance portion has an electric resistance higher than that of the photoconductive portion.

3. A terahertz wave generating apparatus, comprising:
   a photoconductive device according to claim 1;
   an irradiation portion for irradiating the gap with excitation light; and
   a voltage applying portion for applying a voltage between the first and second conductive portions.

* * * * *